US008994396B2

(12) United States Patent
Ho et al.

(10) Patent No.: US 8,994,396 B2
(45) Date of Patent: Mar. 31, 2015

(54) VARIATION-TOLERANT SELF-REPAIRING DISPLAYS

(75) Inventors: Chih-Hsiang Ho, West Lafayette, IN (US); Chao Lu, West Lafayette, IN (US); Debabrata Mohapatra, West Lafayette, IN (US); Kaushik Roy, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 502 days.

(21) Appl. No.: 13/349,722

(22) Filed: Jan. 13, 2012

(65) Prior Publication Data

US 2012/0182518 A1 Jul. 19, 2012

Related U.S. Application Data

(60) Provisional application No. 61/433,103, filed on Jan. 14, 2011.

(51) Int. Cl.
*G01R 31/26* (2014.01)
*G09G 3/32* (2006.01)
*G09G 3/36* (2006.01)

(52) U.S. Cl.
CPC ............ *G09G 3/3233* (2013.01); *G09G 3/3648* (2013.01); *G09G 2310/08* (2013.01); *G09G 2320/0233* (2013.01); *G09G 2320/0285* (2013.01); *G09G 2330/08* (2013.01); *G09G 2330/10* (2013.01); *G09G 2330/12* (2013.01)
USPC .................................................... 324/760.01

(58) Field of Classification Search
CPC .......... G09G 3/006; G09G 2300/0809; G09G 3/3208; G09G 3/3611
See application file for complete search history.

(56) References Cited

U.S. PATENT DOCUMENTS

| | | | | |
|---|---|---|---|---|
| 5,144,446 | A * | 9/1992 | Sudo et al. | 348/246 |
| 8,633,921 | B2 * | 1/2014 | Huang et al. | 345/211 |
| 2006/0145989 | A1 * | 7/2006 | Han et al. | 345/92 |

OTHER PUBLICATIONS

M. Bagheri et al., "Fast Voltage-Programmed Pixel Architecture for AMOLED Displays," Journal of Display Technology, Apr. 7, 2010, pp. 191-195, vol. 6.

C.J. Brown et al., "A Continuous-Grain Silicon-System LCD with Optical Input Function," IEEE Journal of Solid-State Circuits, Dec. 2007, pp. 2904-2912, vol. 42.

H.J. Chung, "Dual-Gate Polycrystalline Silicon Thin-Film Transistors with Intermediate Lightly Doped Region," Japanese Journal of Applied Physics, Aug. 4, 2006, pp. 6182-6185, vol. 45.

C.A. Dimitriadis et al., "On the Threshold Voltage and Channel Conductance of Polycrystalline Silicon Thin-Film Transistors," Journal of Applied Physics, Apr. 15, 1996, pp. 4431-4437, vol. 79.

(Continued)

*Primary Examiner* — Tung X Nguyen

(74) *Attorney, Agent, or Firm* — Lee & Hayes, PLLC; Christopher J. White

(57) ABSTRACT

Illustrative embodiments of systems and methods for variation-tolerant, self-repairing displays are disclosed. In one illustrative embodiment, a display panel may include one or more defective pixels and a compensation circuit may be configured to extend a charging time of each of the one or more defective pixels. In another illustrative embodiment, a method may include detecting one or more defective pixels in a pixel array and extending a charging time of each of the one or more defective pixels.

11 Claims, 10 Drawing Sheets

(56) References Cited

OTHER PUBLICATIONS

S.I. Hsieh et al., "Threshold Voltage Uniformity Enhancement for Low-Temperature Polysilicon Thin-Film Transistors Using Tilt Alignment Technique," Electrochemical and Solid State Letters, May 4, 2006, pp. H57-H60, vol. 9.

S. Inoue et al., "Analysis and Classification of Degradation Phenomena in Polycrystalline Silicon Thin Film Transistors Fabricated by a Low-Temperature Process Using Emission Light Microscopy," Japanese Journal of Applied Physics, Mar. 2003, pp. 1168-1172, vol. 42.

S. Jagar et al.,"A SPICE Model for Thin-Film Transistors Fabricated on Grain-Enhanced Polysilicon Film," IEEE Transactions on Electron Devices, Apr. 2003, pp. 1103-1108, vol. 50.

E. Kanda et al., "Active-Matrix Sensor in AMLCD Detecting Liquid-Crystal Capacitance with LTPS-TFT Technology," Journal of the Society for Information Display, Feb. 2009, pp. 79-85, vol. 17.

W.H. Kuo et al., "2D/3D Dual-Image Switchable Display," Society for Information Display Symposium Digest of Technical Papers, 2008, pp. 264-266.

J. Li et al., "Variation Estimation and Compensation Technique in Scaled LTPS TFT Circuits for Low-Power Low-Cost Applications," IEEE Transactions on Computer-Aided Design of Integrated Circuits and Systems, Dec. 17, 2008, pp. 46-59, vol. 28.

J. Li et al., "Poly-Si Thin-Film Transistors: An Efficient and Low-Cost Option for Digital Operation," IEEE Transactions on Electron Devices, Nov. 2007, pp. 2918-2929, vol. 54.

Y. Nakajima et al., "Ultra-Low-Power LTPS TFT-LCD Technology Using a Multi-Bit Pixel Memory Circuit," Journal of the Society for Information Display, Dec. 2006, pp. 1071-1075, vol. 14.

P.S. Shih et al., "A Novel Lightly Doped Drain Polysilicon Thin-Film Transistor with Oxide Sidewall Spacer Formed by One-Step Selective Liquid Phase Deposition," IEEE Electron Device Letters, Aug. 1999, pp. 421-423, vol. 20.

Y.H. Tai et al., "A Statistical Model for Simulating the Effect of UPS TFT Device Variation for SOP Applications," Journal of Display Technology, Dec. 2007, pp. 426-433, vol. 3.

A.W. Wang et al., "A Strategy for Modeling of Variations Due to Grain Size in Polycrystalline Thin-Film Transistors," IEEE Transactions on Electron Devices, May 2000, pp. 1035-1043, vol. 47.

W.J. Wu et al., "A Compact Model for Polysilicon TFTs Leakage Current Including the Poole-Frenkel Effect," IEEE Transactions on Electron Devices, Nov. 2007, pp. 2975-2983, vol. 54.

T. Yoshida et al., "Experimental Evidence of Grain-Boundary Related Hot-Carrier Degradation Mechanism in Low-Temperature Poly-Si Thin-Film-Transistors," International Electron Devices Meeting Technical Digest, 2003, pp. 219-222.

S. M. Sze, VLSI Technology, Second Edition, 1988, pp. 617-618 (McGraw-Hill, New York, U.S.A.).

* cited by examiner

VARIATION-TOLERANT SELF-REPAIRING DISPLAYS

CROSS-REFERENCE TO RELATED APPLICATIONS

This application claims priority under 35 U.S.C. §119(e) to U.S. Provisional Patent Application Ser. No. 61/433,103, filed on Jan. 14, 2011, and entitled "Variation-Tolerant Self-Repairing Displays," the entire disclosure of which is expressly incorporated herein by reference.

STATEMENT REGARDING FEDERALLY SPONSORED RESEARCH

This invention was made with government support under Grant No. CCF-1018205 awarded by the National Science Foundation. The U.S. Government has certain rights in the invention.

BACKGROUND

The present disclosure relates, generally, to liquid crystal displays and active-matrix organic light emitting diode displays and, more particularly, to a variation-tolerant, self-repairing design methodology that may be used to compensate for variations in the low temperature polycrystalline silicon thin film transistors used in such displays.

In response to the rapid growth of demand for low power, high resolution, and low cost electronic displays, various advanced displays have been developed. Examples include three-dimensional (3D) displays for more attractive and exciting viewing experiences, memory-integrated displays for extremely low power consumption, and displays with in-cell touch and photo sensors for intuitive screen operation. These and other advanced displays require either high pixel density or multiple transistors in each pixel, leading to a small aperture ratio. This small aperture ratio, however, greatly increases the total power needed to maintain the same display luminance. Consequently, the scaling of transistor size into the nanometer regime is inevitable for retaining sufficient aperture ratio.

Low temperature polycrystalline silicon (LTPS) thin film transistors (TFTs) are promising devices for the backplane electronics of high-performance liquid crystal displays (LCDs) and active-matrix organic light emitting diode (AMOLED) displays, due to their higher driving capability, lower operating voltage, and better reliability than the amorphous silicon TFT. However, LTPS TFTs suffer from a diverse and complicated grain distribution, and a spread in the electrical characteristics of individual LTPS TFTs (e.g., threshold voltage, mobility, etcetera) is unavoidable. This often results in high leakage and low drivability transistors in a portion of pixels and, hence, causes non-uniformity of brightness over the display area. In addition, the spread of device characteristics deteriorates with device scaling, especially when the grain size is close to the device dimension. Such severe device variations not only limit the application of LTPS technology in large-sized displays but also inhibit TFT scaling for low power, high pixel density, and high integration.

Conventionally, the peripheral and control circuits of an LTPS-based display use bulk silicon and are integrated externally. As a result, the peripheral and control circuits are less susceptible to variations, as compared to the LTPS pixel array. Minimizing the variation in pixel switches is important for robust panel design. Several techniques for decreasing the variation of leakage current in pixel switches have been proposed. Mitigating the electric field near the drain region, using a lightly doped drain (LDD), and employing a dual-gate structure can effectively reduce the leakage current induced by the field emission via trap states. Techniques for suppressing the variation in drivability of pixel switches, however, have been rarely discussed. To ensure sufficient drivability in all pixel switches, increasing the supply voltage to account for the worst-case combination of variables is the most commonly applied technique. High supply voltage greatly increases power consumption and worsens the reliability of TFTs. Moreover, as the panel size or resolution is increased, yield loss—due to grain boundaries (GBs) and global variation—becomes more and more significant, even with a high supply voltage. These drawbacks have impeded the wide deployment of LTPS-based display technologies.

SUMMARY

According to one aspect, an apparatus may comprise a display panel including one or more defective pixels and a compensation circuit configured to extend a charging time of each of the one or more defective pixels. The one or more defective pixels may comprise one or more pixels that each have a drivability below a predetermined threshold. The display panel may comprise a liquid crystal display including a number of low temperature polycrystalline silicon thin film transistors. The display panel may alternatively comprise an active-matrix organic light emitting diode display including a number of low temperature polycrystalline silicon thin film transistors.

In some embodiments, the compensation circuit may comprise a detector configured to determine a location of each of the one or more defective pixels. The detector may comprise a plurality of comparators, where each of the plurality of comparators is electrically coupled to a reference voltage and to a data line of the display panel. The compensation circuit further may comprise a memory unit configured to store the location of each of the one or more defective pixels.

In other embodiments, the compensation circuit may comprise a clock signal generator configured to apply a basic clock signal to at least some pixels of the display panel and to apply an extended clock signal to each of the one or more defective pixels. The extended clock signal may comprise multiple periods of the basic clock signal. The clock signal generator may comprise a clock selector configured to select a frequency of the basic clock signal in response to a total number of defective pixels in the display panel.

According to another aspect, an apparatus may comprise a display panel including a plurality of pixel rows and a compensation circuit configured to detect whether each of the plurality of pixel rows includes one or more defective pixels, to apply a basic clock signal to each of the plurality of pixel rows that does not include one or more defective pixels, and to apply an extended clock signal to each of the plurality of pixel rows that includes one or more defective pixels. The extended clock signal may comprise multiple periods of the basic clock signal.

According to yet another aspect, a method may comprise detecting one or more defective pixels in a pixel array and extending a charging time of each of the one or more defective pixels. Detecting the one or more defective pixels may comprise detecting one or more pixels that each have a drivability below a predetermined threshold. Detecting the one or more defective pixels may comprise pre-charging a data line of the pixel array and comparing a voltage level of the data line to a reference voltage level after turning on a pixel that is electrically coupled to the data line.

In some embodiments, detecting the one or more defective pixels may comprise detecting each row in the pixel array that includes one or more defective pixels. Extending the charging time of each of the one or more defective pixels may comprise applying a basic clock signal to each row in the pixel array that does not include one or more defective pixels and applying an extended clock signal to each row in the pixel array that includes one or more defective pixels. Applying the extended clock signal to each row in the pixel array that includes one or more defective pixels may comprise applying multiple periods of the basic clock signal to each row in the pixel array that includes one or more defective pixels. The method may further comprise selecting a frequency of the basic clock signal in response to a total number of the rows in the pixel array that include one or more defective pixels. Detecting the one or more defective pixels in the pixel array may comprise testing the pixel array each time a display panel including the pixel array is reset.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION OF THE DRAWINGS

Figure 1A:
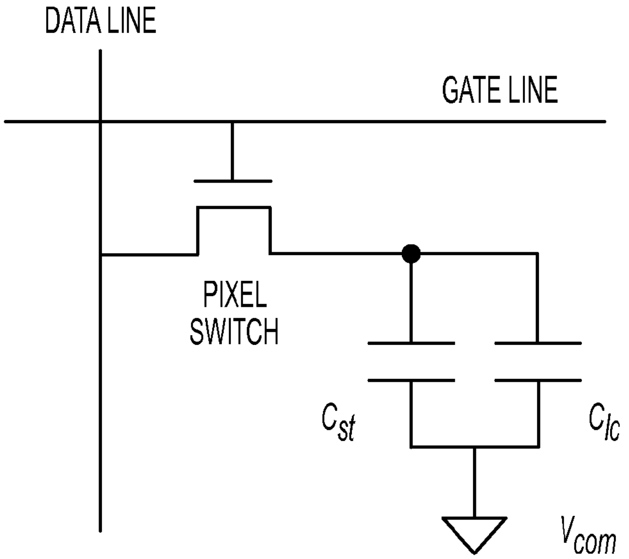
FIG. 1A is a simplified circuit diagram of one embodiment of a pixel structure of an LCD.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives consistent with the present disclosure and appended claims.

In the following description, numerous specific details such as logic implementations, opcodes, means to specify operands, resource partitioning/sharing/duplication implementations, types and interrelationships of system components, and logic partitioning/integration choices may be set forth in order to provide a more thorough understanding of the present disclosure. It will be appreciated, however, by one skilled in the art that embodiments of the disclosure may be practiced without such specific details. In other instances, control structures, gate level circuits, and full software instruction sequences have not been shown in detail in order not to obscure the invention. Those of ordinary skill in the art, with the included descriptions, will be able to implement appropriate functionality without undue experimentation.

References in the specification to “one embodiment,” “an embodiment,” “an illustrative embodiment,” etcetera, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention implemented in a display may include one or more bus-based, or link-based, interconnects between components and/or one or more point-to-point interconnects between components. Embodiments of the invention may also be implemented as instructions carried by or stored on one or more machine-readable media, which may be read and executed by one or more processors. A machine-readable medium may be embodied as any device, mechanism, or physical structure for storing or transmitting information in a form readable by a machine (e.g., a processor). For example, a machine-readable medium may be embodied as read only memory (ROM); random access memory (RAM); magnetic disk storage media; optical storage media; flash memory devices; mini- or micro-SD cards, memory sticks, electrical signals, and others.

In the drawings, specific arrangements or orderings of schematic elements, such as those representing devices, components, modules, instruction blocks, and data elements, may be shown for ease of description. However, it should be understood by those skilled in the art that the specific ordering or arrangement of the schematic elements in the drawings is not meant to imply that a particular order or sequence of processing, or separation of processes, is required. Further, the inclusion of a schematic element in a drawing is not meant to imply that such element is required in all embodiments or that the features represented by such element may not be included in or combined with other elements in some embodiments.

In general, schematic elements used to represent instruction blocks may be implemented using any suitable form of machine-readable instruction, such as software or firmware applications, programs, functions, modules, routines, processes, procedures, plug-ins, applets, widgets, code fragments, and/or others, and that each such instruction may be implemented using any suitable programming language, library, application programming interface (API), and/or other software development tools. For example, some embodiments may be implemented using Java, C++, and/or other programming languages. Similarly, schematic elements used to represent data or information may be implemented using any suitable electronic arrangement or structure, such as a register, data store, table, record, array, index, hash, map, tree, list, graph, file (of any file type), folder, directory, database, and/or others.

Further, in the drawings, where connecting elements (e.g., solid or dashed lines or arrows) are used to illustrate a connection, relationship, or association between or among two or more elements, the absence of any such connecting elements is not meant to imply that no connection, relationship or association can exist. In other words, some connections, relationships or associations between elements may not be shown in the drawings so as not to obscure the disclosure. In addition, for ease of illustration, a single connecting element may be used to represent multiple connections, relationships, or associations between elements. For example, where a connecting element represents a communication of signals, data, or instructions, it should be understood by those skilled in the art that such element may represent one or multiple signal paths (e.g., a bus), as may be needed, to effect the communication.

The present disclosure generally relates to a variation-tolerant, self-repairing design methodology that, from a system and circuit design perspective, may be used to compensate for variations (e.g., grain boundary (GB) induced variations) in LTPS LCDs and AMOLED displays. This design methodology generally involves detecting and extending the charging time for defective pixels (i.e., pixels with low drivability). Among other benefits, this design methodology may suppress brightness non-uniformity in the display and may eliminate the need for large voltage margins. The present disclosure describes systems and methods that may implement this functionality at the expense of a slight increase in the operating frequency of peripheral circuits. In other words, to maintain the same refresh rate, the charging time of each row of a pixel array may be slightly decreased to create timing slacks that allow certain rows of pixels to execute a two-cycle operation. A lower supply voltage may then be used for the pixels, since defective pixels are provided an extended charging time. Consequently, the presently disclosed systems and methods are capable of not only improving yield but also reliability under low voltage operation.

The presently disclosed design methodology was implemented in VGA LCD panels, which were used to predict power consumption and yield. Based on simulation results, the design methodology may decrease the required supply voltage by twenty percent, without performance and yield degradation. A seven percent yield enhancement was also observed for high resolution, large-sized LCDs, while incurring a negligible power penalty. Thus, the presently disclosed systems and methods may enable LTPS-based displays to further scale down device size for higher integration and lower power consumption and/or to have superior yield in large-sized panels with small power overhead.

Figure 1B:
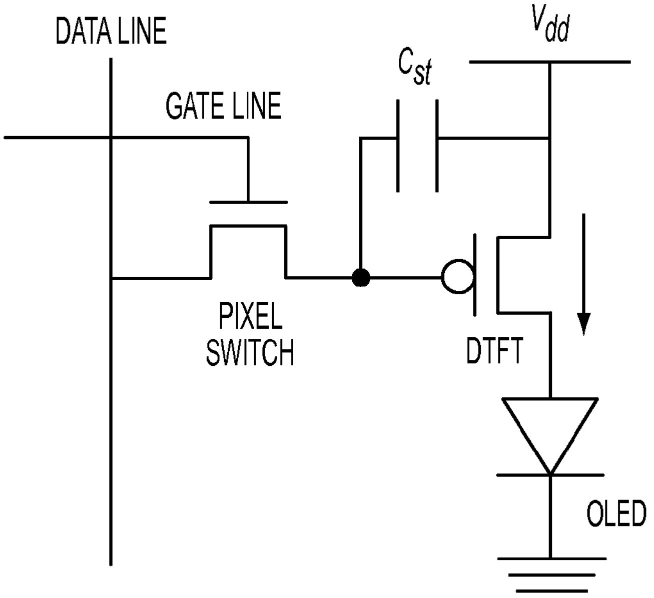
FIG. 1B is a simplified circuit diagram of one embodiment of a pixel structure of an AMOLED display.

Illustrative embodiments of pixel structures of LCDs and of AMOLED displays are shown in FIGS. 1A and 1B, respectively. As can be seen in FIGS. 1A and 1B, the general requirements for pixel switches in LCDs and AMOLED displays may be identical. Pixel switches in LCDs and AMOLED displays should be capable of charging a storage capacitor ($C_{st}$) close to the data voltage on the data line during a short charging time. Furthermore, during a long hold time, leakage current through the pixel switches should be minimized to retain the same brightness. Although many AMOLED design techniques focus on compensating for variations in the driving TFT (DTFT), the variation in pixel switches is also a root causes of uniformity issues. The presently disclosed systems and methods may improve uniformity issues caused by insufficient drivability in both LTPS-based LCDs and AMOLED displays. Although the present disclosure focuses on illustrative embodiments implemented in LCDs, those of skill in the art will appreciate its application to AMOLED displays, due to their similar pixel structures.

Figure 2:
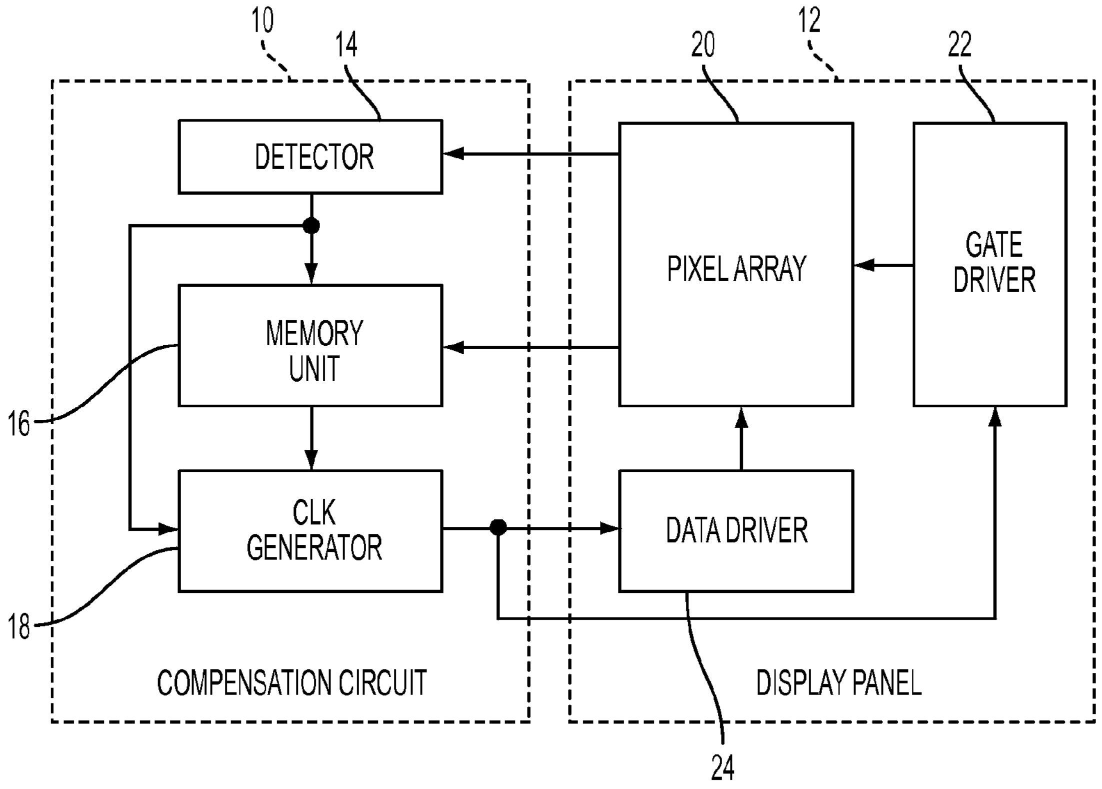
FIG. 2 is a simplified block diagram of one embodiment of a compensation circuit for a display panel.

One illustrative embodiment of a compensation circuit 10 for a display panel 12 is illustrated in FIG. 2 as a simplified block diagram. In the illustrative embodiment, the compensation circuit 10 includes a detector 14, a memory unit 16, and a clock signal (CLK) generator 18. The detector 14 is configured to detect defective pixels in a pixel array 20 of the display panel 12 and to generate signals for the memory unit 16 and the CLK generator 18. The memory unit 16 is configured to store the location of defective pixels and to generate two-cycle enabling signals for the CLK generator 18. The CLK generator 18 is configured to determine a CLK frequency from the output of the detector 14 and to generate one or more modified clock signals that give defective pixels in the pixel array 20 a two-cycle charging time.

In the illustrative embodiment, the operation of the compensation circuit 10 may be described in three phases: a set-up phase, a detection phase, and a display phase. In the set-up phase, a data pattern requiring the longest charging time is used for determining the locations of defective pixels in the pixel array 20. This data pattern may involve discharging pixel voltage to a minimal level in an initial time frame and recharging pixel voltage to a maximum level in a subsequent frame time. In the detection phase, the detector 14 is responsible for defect detection. Detection results are stored in the memory unit 16 and forwarded to the CLK generator 18. The CLK generator 18 selects the proper clock signal according to the number of faulty rows (i.e., rows in the pixel array 20 containing defective pixels) recorded in a multi-bit counter (e.g., a four-bit counter). In the display phase, an adaptive clock signal is produced by processing the output of the memory unit 16 and the selected clock signal with CLK generator 18. The detailed operation of the detector 14, the memory unit 16, and the CLK generator 18 are each further described below.

Figure 3:
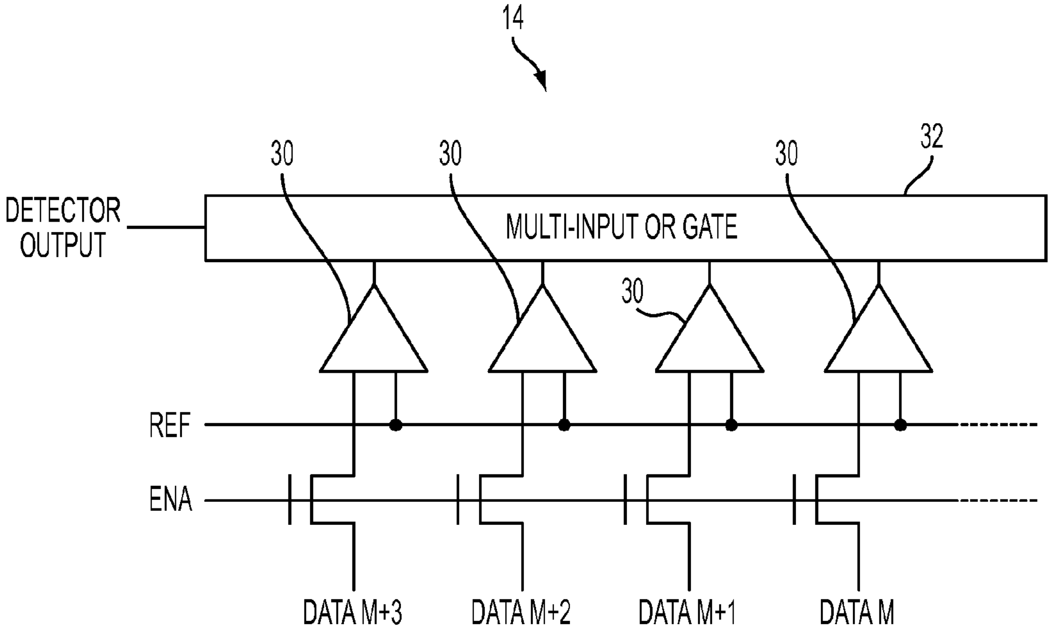
FIG. 3 is a simplified circuit diagram of one embodiment of a detector that may be used in the compensation circuit of FIG. 2.

As shown in FIG. 3, one illustrative embodiment of the detector 14 includes a number of comparators 30 and a multi-input OR gate 32. The comparators 30 of the detector 14 may be designed to be variation-tolerant using proper design techniques (e.g., the matched filter structure). During the set-up phase, a detection enable signal, ENA, is set to be low, isolating the detector 14 from the memory unit 16 and the pixel array 20. During the detection phase, ENA is set to be high. The data lines may be pre-charged to the maximum level. After a gate driver 22 turns on one row of pixel switches in the pixel array 20, charge sharing starts between the data lines and pixels. The data line voltage will either remain at the same level (with normal pixels) or settle at a lower voltage level (with defective pixels). The amount of voltage drop will depend on a ratio between the parasitic capacitance of the data line and the storage capacitance of the pixel. The comparators 30 compare the voltage level of each data line with a reference voltage, REF, to judge the existence of defective pixels. In the illustrative embodiment, a row of pixel array 20 is defined to be faulty if the voltage in any of the pixels in that row is lower than the reference voltage. This logic may be performed by processing the output results of each comparator 30 in the multi-input OR gate 32. An output signal for each detected row is generated by multi-input OR gate 32 and delivered to the memory unit 16 and the CLK generator 18. In the display phase, ENA is again set to be low (once again isolating the detector 14 from the memory unit 16 and the pixel array 20).

Figure 4:
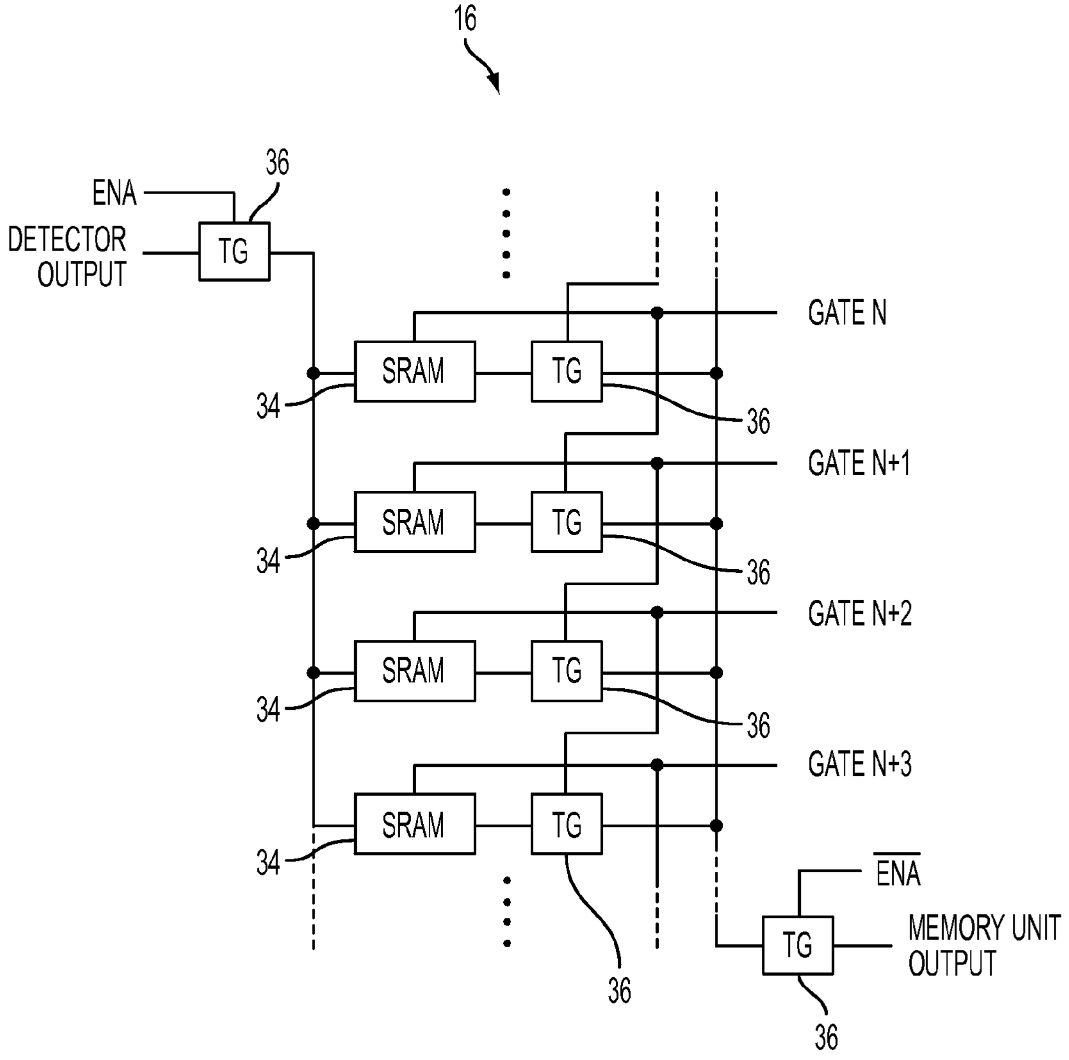
FIG. 4 is a simplified circuit diagram of one embodiment of a memory unit that may be used in the compensation circuit of FIG. 2.
Figure 5:
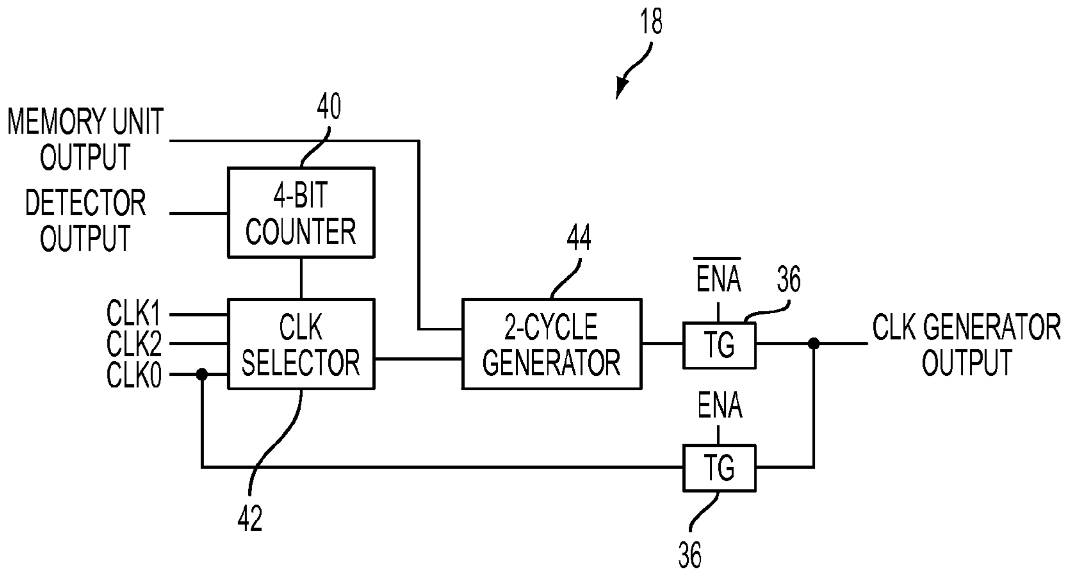
FIG. 5 is a simplified circuit diagram of one embodiment of a CLK generator that may be used in the compensation circuit of FIG. 2.

Referring now to FIG. 4, one illustrative embodiment of the memory unit 16 includes a number of static random access memories (SRAMs) 34 and a number of transmission gates (TGs) 36. During the detection phase, ENA is set to be high, connecting an input of the memory unit 16 to the output of the detector 14 and blocking an output of the memory unit 16 to the CLK generator 18. Since the access transistors of each SRAM 34 are controlled by a specific gate line, each output signal of the detector 14 is written in a corresponding SRAM 34 during the detection phase. In the display phase, the memory unit 16 stops receiving signals from the detector 14 and connects to the CLK generator 18 since ENA is set to be low. The values stored in SRAMs 34 are forwarded sequentially to the CLK generator 18 and used for modulating a CLK period during the display phase. As described below, additional cycles (e.g., a two-cycle operation) for charging the faulty rows are then accommodated within the available refresh rate.

Figure 6:
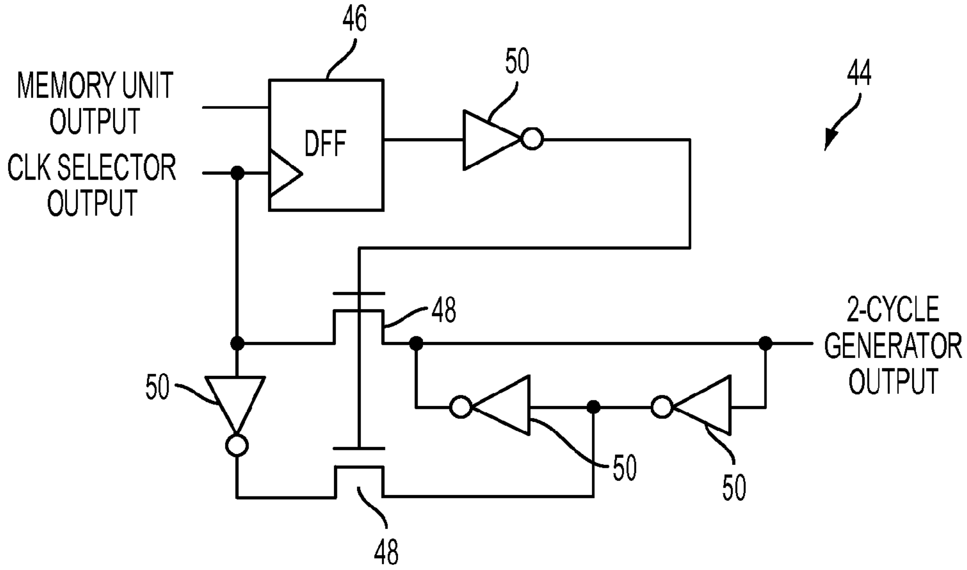
FIG. 6 is a simplified circuit diagram of one embodiment of a two-cycle generator that may be used in the CLK generator of FIG. 5.

As shown in FIG. 4, one illustrative embodiment of the CLK generator 18 includes a four-bit binary counter 40, a CLK selector 42, and a two-cycle generator 44. The basic clock signals CLK0, CLK1, and CLK2 differ in their operating frequencies. CLK0, with the lowest frequency, is set to be the default clock signal used in the detection phase, while CLK1 or CLK2 may be used when faulty rows exist. Higher frequency basic clock signals enable more timing slacks, which allow more two-cycle operations. It will be appreciated that the frequency should be selected to prevent increased failure of normal pixels due to a shorter charging time. After receiving output signals from detector 14 in the detection phase, the four-bit binary counter 40 generates output signals which allow the CLK selector 42 to select an appropriate basic clock signal based on the total number of faulty rows present (e.g., CLK0 is selected when no faulty rows exist). The two-cycle generator 44, one illustrative embodiment of which is illustrated in FIG. 6, may include a D flip-flop (DFF) 46, two access transistors 48, and four inverters 50. In the display phase, the selected basic clock signal from the CLK selector 42 will be processed with the output signals from memory unit 16 in the DFF 46 to generate an output signal for enabling two-cycle operation. If the output of the memory unit 16 is high, the DFF 46 will generate a high signal to isolate the selected basic clock signal from the output by the access transistors 48. In the mean time, the output value of the previous cycle is held by the cross-coupled invertors 50 leading to an extended clock signal. When the output of the memory unit 16 is low, the selected basic clock signal from the CLK selector 42 will become the output of the two-cycle generator without any modification.

Figure 7:
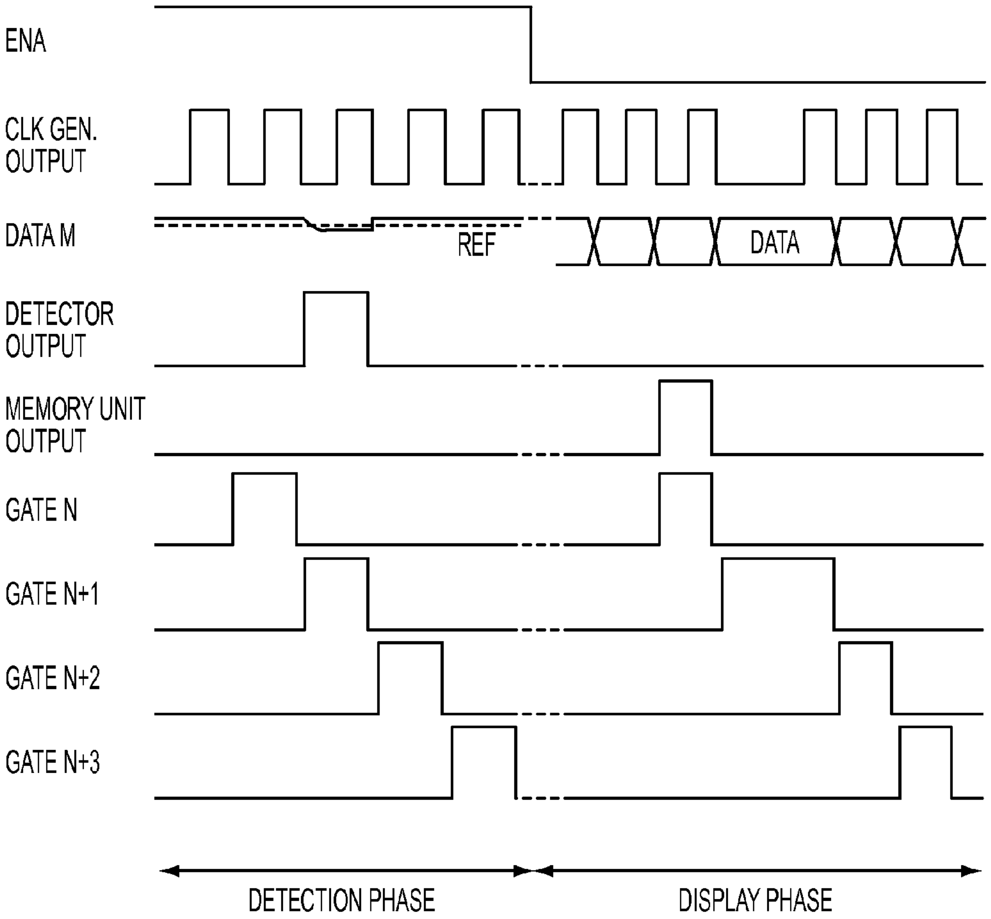
FIG. 7 is a simplified timing diagram illustrating one embodiment of a two-cycle operation that may be used with the compensation circuit of FIG. 2.

An illustrative timing diagram of a two-cycle operation for a compensation circuit 10 and a display panel 12 that has a defective pixel in the $(N+1)^{th}$ row is shown in FIG. 7. In the detection phase, as the defective pixel is detected in the $(N+1)^{th}$ row, a pulse from the detector 14 is generated in the $(N+1)^{th}$ clock cycle. In the display phase, a specific basic clock signal is selected corresponding to the number of faulty rows obtained in the detection phase. The memory unit 16 generates a pulse in the $N^{th}$ clock cycle causing an extended clock signal to occur in the $(N+1)^{th}$ clock cycle, permitting doubled charging time for the $(N+1)^{th}$ row. In the $(N+2)^{th}$ row, the basic clock signal resumes.

The supply voltage and yield for designs including the compensation circuit 10 described above were compared with conventional designs. For the sake of brevity and clarity, the focus of this simulation was limited to grain boundary induced variations. However, it will be appreciated by those of skill in the art that the presently disclosed technique is also effective in addressing variations due to other process parameters. A Monte Carlo method was utilized to estimate the yield. The standard deviations of threshold voltages and mobilities for the Monte Carlo simulation were acquired using the models described below.

In most crystallization processes of polycrystalline silicon, crystal grain grows in a random manner, thereby introducing randomly distributed grain boundaries (GBs). These GBs may result in significant variation in electrical parameters between neighboring transistors. First, a device model of the interrelations between grain size and device characteristics was considered. Then, the standard deviations of threshold voltages and mobilities were derived for use in subsequent Monte Carlo simulations. Assuming that GBs are distributed in a Gaussian way, the Poisson area scatter distribution may be employed to model the number of grains in a given area:

$$P(k) = \frac{[\exp(-\lambda)\cdot\lambda^k]}{k!}, \tag{1}$$

where k is the Poisson random variable and λ is the mean. To correlate the average grain size with the Poisson random variable, k may be assumed to be the number of grains in a channel of a TFT. The average grain size, $L_{g,TFT}$, is then given by:

$$L_{g,TFT} = \sqrt{\frac{W\cdot L}{k}}. \tag{2}$$

Based on models which physically relate $L_{g,TFT}$ to TFT behavior, the variation ranges for threshold voltages and mobilities were evaluated. Aside from body doping and gate oxide thickness, the threshold voltage of an LTPS TFT is influenced by the defect states in GBs. The presence of defect states leads to the trapping of free charge carriers. To overcome the trapped charge effect, an extra voltage needs to be applied. The threshold voltage ($V_{th}$) model is given by:

$$V_{th} = V_{FB} + \left[1 - \left(\frac{\varepsilon_{Si} E_{sc} L_{g,TFT}}{q N_{tr} L}\right)\right] \sqrt{\frac{8kTN_{tr}t_{ox}}{C_{ox} L_{g,TFT}} \sqrt{\frac{\varepsilon_{Si}}{\varepsilon_{oxi}}}}, \quad (3)$$

where $V_{FB}$ is the flatband voltage (−0.51V), $L_{g,TFT}$ is the average grain size (800 nm), $N_{tr}$ is the monoenergetic trap density ($2\times10^{13}$ $cm^2$), $t_{ox}$ is the gate oxide thickness (30 nm), and $E_{SC}$ is the short-channel field parameter (5.3 MV/cm). The term in the bracket represents a semi-empirical short channel correction for some of the GBs charged by the drain in the channel. The term under the radical is for the trapped charge effect—free charges are depleted from the inversion layer by the trapped charges in GBs.

Figure 8:
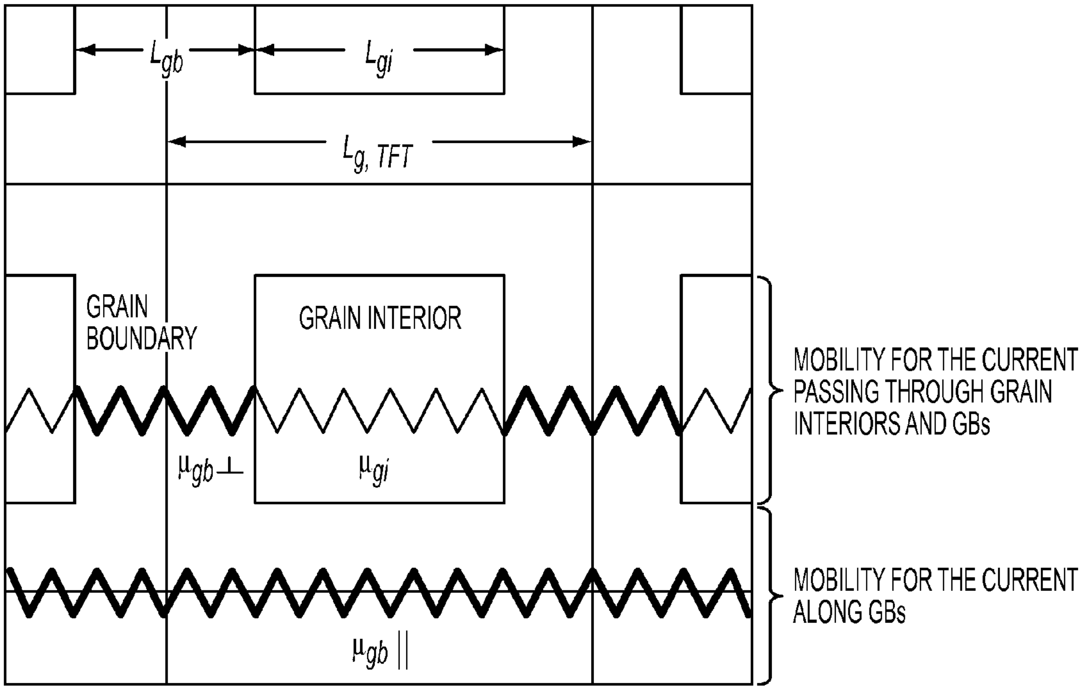
FIG. 8 is a simplified schematic illustrating an effective mobility model for TFTs.

To model mobility, a TFT channel region was decomposed into grain interiors and GBs. The effective mobility of TFTs can be regarded as the weighted sum of the carrier mobility along the GBs and of the carrier mobility through grain interiors and GBs, as illustrated in FIG. 8. The effective mobility ($\mu$) thus follows:

$$\mu = \left(\frac{l_{gb}}{L_{g,TFT}}\right) \cdot \mu_{gb\perp} + \left[1 - \left(\frac{l_{gb}}{L_{g,TFT}}\right)\right] \mu_g. \quad (4)$$

The characteristic of $\mu_g$ is given by:

$$\mu_g = \mu_{gi} L_{eff} \left\{(N-1)\left[l_{gi} + \left(\frac{\mu_{gi}}{\mu_{gb\perp}}\right) l_{gb}\right] + L_{g,TFT}\right\}^{-1}, \quad (5)$$

where $l_{gb}$ is the effective GB width (100 nm), $\mu_{gi}$ is the interior mobility (300 $cm^2$/V·s), $\mu_{gb}\perp$ is the transverse boundary mobility (30 $cm^2$/V·s), and $\mu_{gb}\|$ is the longitudinal boundary mobility (3 $cm^2$/V·s). Trapped carriers at the GBs increase scattering in the channel, and therefore, $\mu_{gi} \gg \mu_{gb}\perp$. $\mu_{gb}\perp$ represents the combination of both a scattering effect when the carriers penetrate the GBs and a reduced trap density near the GBs. Compared to $\mu_{gb}\perp$, $\mu_{gb}\|$ is small since a high probability of scattering is observed when carriers travel along the GBs. Those of skill in the art will appreciate from Eq. (4) and (5) that the nominal effective mobility increases as the transistor size shrinks due to a reduced number of GBs in the channel.

Figure 9A:
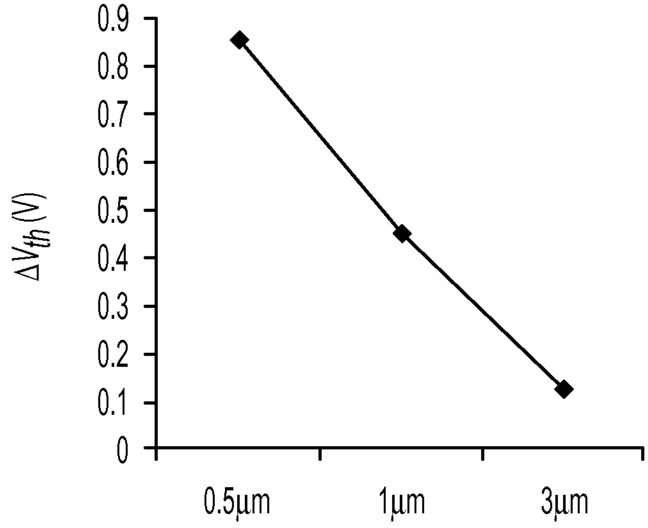
FIG. 9A illustrates a calculated standard deviation of threshold voltages for different TFT sizes.
Figure 9B:
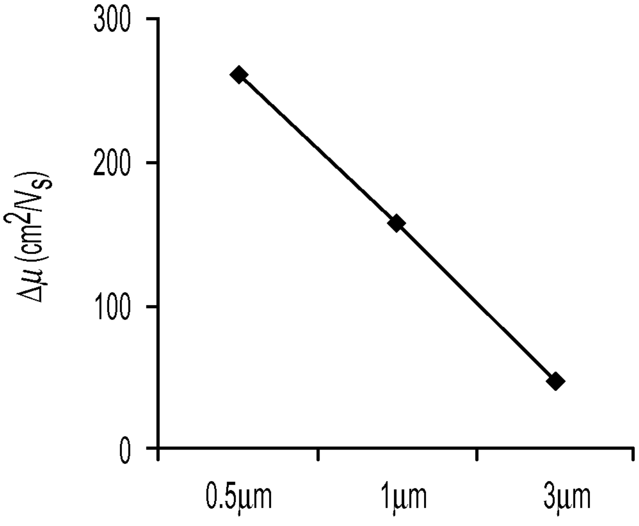
FIG. 9B illustrates a calculated standard deviation of mobilities for different TFT sizes.

The calculated standard deviations of threshold voltages and mobilities for different TFT sizes are plotted in FIGS. 9A and 9B, respectively. Increased spread in both the threshold voltage and the mobility is observed as device size decreases. This is due to the increased variation of average grain size when the size of device shrinks.

In order to increase the computation efficiency of the Monte Carlo simulation, the complexity of the display panel 12 was simplified. One pixel model with twelve sets of RC loading was applied in the simulation. Different sets of loading represent different locations of pixels in the display area. The characteristics of the LCD panels evaluated in this simulation are shown in Table 1 below.

TABLE 1

| | | | |
|---|---|---|---|
| Panel Size (inches) | 3.9 | 0.85 | 0.4 |
| Switch TFT (W/L) | 3/3 μm | 1/1 μm | 0.5/0.5 μm |
| Resolution (H/V) | | 640/480 | |
| Gray Level | | 256 | |
| $V_{th}$ of Liquid Crystal (V) | | 3.3 | |
| Refresh Rate (Hz) | | 60 | |

To determine TFT characteristics, the TAURUS device simulator was used. The parameter extraction for the HSPICE RPI Poly-Si TFT model was done using Aurora. The parametric variations were lumped into threshold voltage and mobility variations. The standard deviation of threshold voltage and mobility for the Monte Carlo simulation were modeled as described above. For the power estimation, an on-glass gate driver 22 and multiplexer (MUX) were assumed, while the data driver 24 was integrated externally. The gate driver 22 with the calculated load was simulated in HSPICE for estimating power consumption. The power consumptions of the MUX and the data driver 24 were calculated using $f \cdot C \cdot V^2$ (where f is frequency, C is capacitance, and V is voltage swing). Simulations began with the nominal parameters and no variations to determine a solution meeting the specification. Thereafter, variations were included to determine suitable supply voltages meeting the yield constraint.

Figure 10:
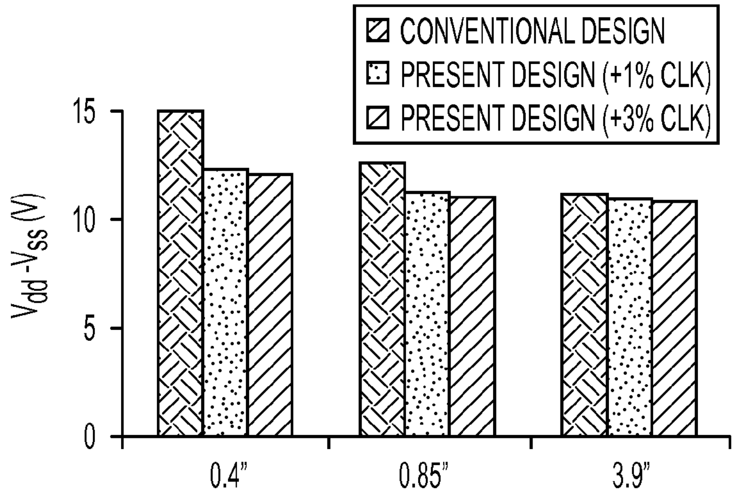
FIG. 10 illustrates a comparison of $V_{dd}-V_{ss}$ for a conventional design and for the presently disclosed design (with 1% and 3% increases in clock frequency) at different technology nodes.

The $V_{dd}$–$V_{ss}$ obtained from 640×480×100 Monte Carlo simulations (i.e., the total number of pixels in 100 LCD panels with VGA resolution) is graphically shown in FIG. 10. It can be observed that the required $V_{dd}$–$V_{ss}$ increases as the device size decreases. This is because $V_{dd}$ and $V_{ss}$ are mainly determined by the threshold voltage of liquid crystal and the transistor variations. Since smaller transistors have larger variations, as shown in FIGS. 9A and 9B, higher supply voltages are needed for compensation. However, higher supply voltages not only raise the power consumption but also aggravate the reliability of the TFTs. Due to the existence of GBs and poor heat dissipation in TFTs, hot carrier and self-heating can cause serious problems in TFT-based devices. When devices are subjected to a high field, hot carriers (generated near the drain edge) are easily trapped at GBs or damage the gate oxide, thereby degrading the leakage current and drivability of the devices. As the TFT turns on, the channel temperature is elevated by Joule heating. Deteriorated heat dissipation, due to glass substrate and high supply voltage, makes TFT-based devices more vulnerable at high temperature. As a result, the density of mid-gap states in GBs increases, degrading the on-current, off-current, and subthreshold swing of the TFTs. Consequently, the reduction of supply voltages is desirable for small-dimension TFTs. As shown in FIG. 10, the presently disclosed designs effectively reduce the required $V_{dd}$–$V_{ss}$ when compared to a conventional design for each technology node. The advantage becomes more apparent as the transistor size shrinks. Hence, with reduced supply voltage, the presently disclosed systems and methods not only decrease the power consumption but also provide relief from hot carrier and self-heating constraints for scaled-down devices.

Figure 11:
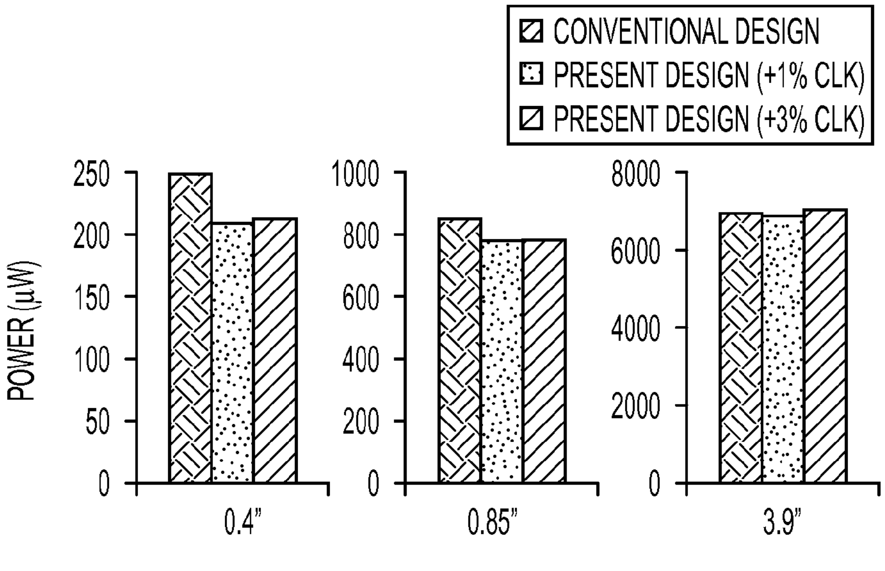
FIG. 11 illustrates a comparison of power consumption for a conventional design and for the presently disclosed design (with 1% and 3% increases in clock frequency) at different technology nodes.
Figure 12:
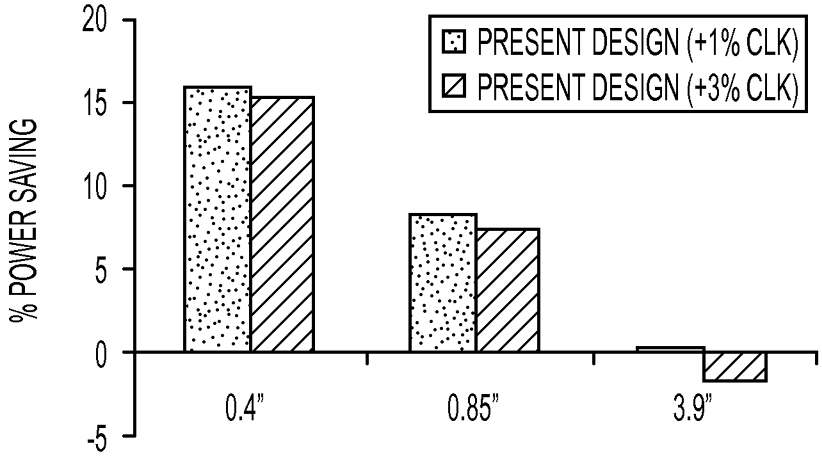
FIG. 12 illustrates a comparison of power savings for a conventional design and for the presently disclosed design (with 1% and 3% increases in clock frequency) at different technology nodes.

Referring now to FIG. 11, the simulated power consumption of the presently disclosed designs and a conventional design for different technology nodes are shown for comparison. It can be seen that, with shrinkage in device size, the power consumption decreases due to a reduction in switching and coupling capacitances. FIG. 12 illustrates the power savings of the presently disclosed designs at different CLK frequencies for different technology nodes. As expected from FIG. 10, the power saving is larger when the decrease in $V_{dd}$–$V_{ss}$ is larger. It is noteworthy that the ratio of power saving in each technology node does not match with the difference of required $V_{dd}$–$V_{ss}$. This is due to the fact that the voltage swing of the data driver 24 is decided by the threshold voltage of liquid crystal, rather than being dependent on the supply voltage. Although the simulation result shows a relatively small impact in the 3.9 inch panel (3 μm technology node), it will be appreciated that the device model used in this disclosure considers only the GB-induced variations. Other important parameters, such as gate oxide thickness, are treated as constants in this model. As other parametric variations are taken into account, larger variations in threshold voltage and mobility may be observed. Hence, the presently disclosed design technique is expected to have significant advantages in the 3 μm technology node as well.

Figure 13:
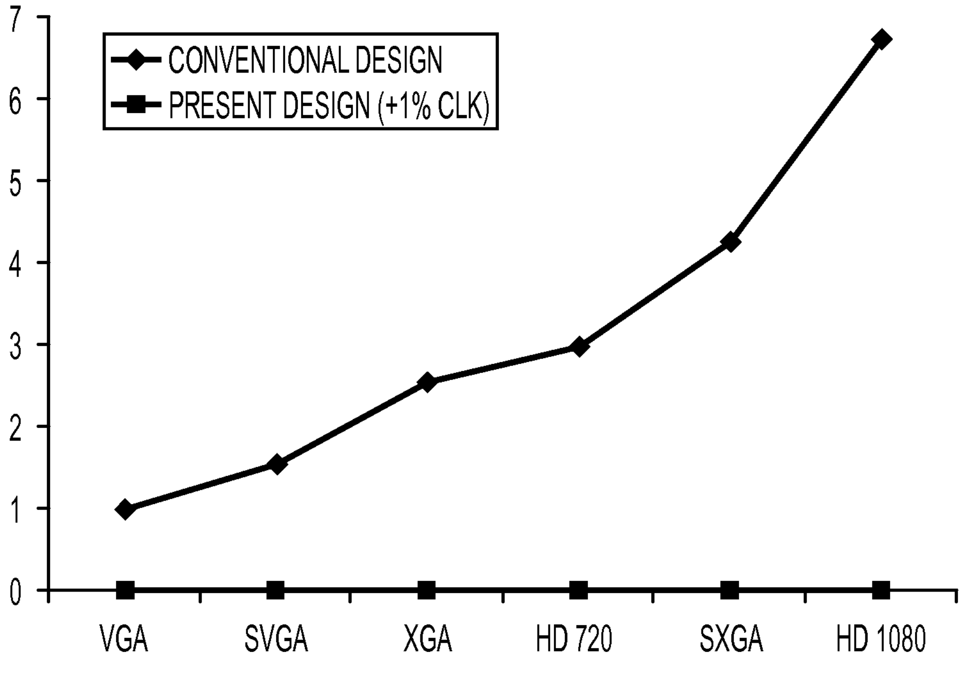
FIG. 13 illustrates a comparison of yield loss for a conventional design and for the presently disclosed design (with a 1% increase in clock frequency) at different resolutions.

Moreover, as the resolution increases, yield loss due to process variations becomes more significant. Assuming the same probability of a defective pixel (at a fixed supply voltage), the increased yield loss in various high-resolution displays is illustrated in FIG. 13. Compared to a conventional design with the same supply voltage, the presently disclosed designs can obtain a higher yield at the expense of negligible power overhead. It will be appreciated that the difference of yield losses between the conventional and presently disclosed designs will be larger if other parametric variations are included.

In addition, many of the parameters and degradations that affect the voltage margin vary over time and temperature. This may result in potential pixel defects being hidden during the testing stage, but showing up when used by consumers. This undesirable issue keeps bothering manufacturers and consumers and cannot be prevented in conventional design. However, with the compensation circuit 10, the display panel 12 may update the number and location of defective pixels whenever desired and, hence, achieve self-repair. In some embodiments, all three phases of operation (i.e., the set-up phase, the detection phase, and the display phase) may be re-performed when the display panel 12 is reset. Thus, better reliability may be achieved. The area overhead of the proposed circuit is approximately 1% and, hence, negligible, due to the relatively small number of transistors in the compensation circuit 10 as compared to the number of transistors in the pixel array 20. Furthermore, as the resolution or size of the display increases, the area overhead decreases.

While certain illustrative embodiments have been described in detail in the drawings and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the systems and methods described herein. It will be noted that alternative embodiments of the systems and methods of the present disclosure may not include all of the features described yet still benefit from at least some of the advantages of such features. Those of ordinary skill in the art may readily devise their own implementations of systems and methods that incorporate one or more of the features of the present invention and fall within the spirit and scope of the present disclosure.

The invention claimed is:

1. Apparatus, comprising:

a display panel including one or more defective pixels; and a compensation circuit configured to extend a charging time of each of the one or more defective pixels, wherein the compensation circuit comprises a clock signal generator configured to apply a basic clock signal to at least some pixels of the display panel and to apply an extended clock signal to each of the one or more defective pixels.

2. The apparatus of claim 1, wherein the one or more defective pixels comprise one or more pixels that each have a drivability below a predetermined threshold.

3. The apparatus of claim 1, wherein the display panel comprises a liquid crystal display including a number of low temperature polycrystalline silicon thin film transistors.

4. The apparatus of claim 1, wherein the display panel comprises an active-matrix organic light emitting diode display including a number of low temperature polycrystalline silicon thin film transistors.

5. The apparatus of claim 1, wherein the compensation circuit comprises a detector configured to determine a location of each of the one or more defective pixels.

6. The apparatus of claim 5, wherein the detector comprises a plurality of comparators, each of the plurality of comparators being electrically coupled to a reference voltage and to a data line of the display panel.

7. The apparatus of claim 5, wherein the compensation circuit further comprises a memory unit configured to store the location of each of the one or more defective pixels.

8. The apparatus of claim 1, wherein the extended clock signal comprises multiple periods of the basic clock signal.

9. The apparatus of claim 1, wherein the clock signal generator comprises a clock selector configured to select a frequency of the basic clock signal in response to a total number of defective pixels in the display panel.

10. Apparatus comprising:

a display panel including a plurality of pixel rows;

a compensation circuit configured to detect whether each of the plurality of pixel rows includes one or more defective pixels, to apply a basic clock signal to each of the plurality of pixel rows that does not include one or more defective pixels, and to apply an extended clock signal to each of the plurality of pixel rows that includes one or more defective pixels.

11. The apparatus of claim 10, wherein the extended clock signal comprises multiple periods of the basic clock signal.

* * * * *